(12) United States Patent
Chuang

(10) Patent No.: US 7,677,925 B2
(45) Date of Patent: Mar. 16, 2010

(54) MULTI-PORT CONNECTOR HAVING DISPLAYPORT CONNECTOR AND HDMI CONNECTOR

(76) Inventor: Yi-Fang Chuang, 5F, No. 15, Lane 117, Sec. 4, Sanhe Rd., Sanchong City, Taipei County 241 (TW)

( * ) Notice: Subject to any disclaimer, the term of this patent is extended or adjusted under 35 U.S.C. 154(b) by 0 days.

(21) Appl. No.: 12/190,026

(22) Filed: Aug. 12, 2008

(65) Prior Publication Data
US 2009/0142969 A1 Jun. 4, 2009

(30) Foreign Application Priority Data
Nov. 30, 2007 (TW) .............................. 96220429 A

(51) Int. Cl.
*H01R 13/648* (2006.01)
(52) U.S. Cl. ............................... 439/607.25; 439/541.5
(58) Field of Classification Search .............. 439/541.5, 439/607.35–607.4, 607.13, 607.23, 607.24–607.26
See application file for complete search history.

(56) References Cited
U.S. PATENT DOCUMENTS
6,162,089 A * 12/2000 Costello et al. .......... 439/541.5
7,413,467 B1 * 8/2008 Lai et al. .................... 439/489
2007/0243757 A1 * 10/2007 Wan et al. ................. 439/541.5
2008/0092200 A1 * 4/2008 Grady et al. ................. 725/133

* cited by examiner

*Primary Examiner*—Ross N Gushi
(74) *Attorney, Agent, or Firm*—Chun-Ming Shih

(57) ABSTRACT

A multi-port connector having DisplayPort and HDMI connector includes a seat body, a DisplayPort, an HDMI connector, a sealing lid and an outer casing. A first slot and a second slot are respectively arranged on the seat body. At back of the seat body, there is a recessing part, at upper portion of which an assembling opening communicated to the first slot is arranged. A plurality of slots are arranged on a wall surface of the recessing part. The DisplayPort is assembled in the first slot, while the HDMI connector is assembled in the second slot. The sealing lid is assembled to the recessing part. A protruding portion arranged at the sealing lid is assembled to the assembling opening. On a wall surface of the sealing lid, there are a plurality of striping ribs snapped into the slots. The outer casing externally fitted to the seat body is arranged a first perforation and a second perforation at front side face thereof. The first and second perforations respectively correspond to a plug-in opening of DisplayPort and a slot of HDMI connector, while a set of assembling legs are extended at a bottom part of a side face of the outer casing. The multi-port connector is to provide a plug-in function for the transmitting lines of the Displayport and the HDMI.

5 Claims, 5 Drawing Sheets

MULTI-PORT CONNECTOR HAVING DISPLAYPORT CONNECTOR AND HDMI CONNECTOR

BACKGROUND OF THE INVENTION

1. Field of the Invention

The present invention in general relates to a connector, in particular, to a multi-port connector.

2. Description of Prior Art

Following a continuous progress of technology, there are many computer peripherals are manufactured successively. For example, in order to make computer able to be electrically connected to these peripherals of new generation, there are many connecting ports, with various specifications, arranged on a computer's motherboard, so that the computer can be electrically connected to the peripherals through various transmitting lines, making the computer able to output control signal or transmit data to the peripherals, or receive data transmitted back from the peripherals, vice versa.

Please refer to FIG. 1. In recent years, the size of computer has a trend of miniaturization, so the volume of a computer's motherboard 100 is shrunk as well. Under the conditions of a shrunk volume and a limited space of the motherboard 100, how to arrange a plurality of connecting ports with various specifications therein has become a challenging issue for the relative industry. According to the prior arts, as shown in FIG. 1, a printer's connecting port 200 is directly screwed at a supporting body 300, by which the connecting port 200 is overlapped to another or other connectors 200a, 200b, or it is possible to add slots to the connectors with same specification, for example, a USB connector 400 or a PS/2 connector 500, both of which have multi-slots.

Currently, there is a new technical specification of monitor, making consumers use PC, TV, and projector with clearer picture and less connecting lines. This new specification is called "Displayport", which can make audio and image signals of good quality share a common cable, and which has four transmitting channels in total, thus that the data transmitting speed can maximally reach 10.8 Gb per second, while its needed channel number is less than that of current cable interface. In addition, the high definition multimedia interface (HDMI) that is the most popular one currently can provide a data transmitting bandwidth maximally reaching 5 Gbps and can transmit uncompressed audio frequency signals and video frequency signals of high definition. It is unnecessary for the HDMI transmitting interface to undergo a digital/analogous or analogous/digital conversion before transmitting signals, so a video signal transmission with good quality can be obtained. The biggest benefit of applying an HDMI interface is that only one HDMI cable is needed to simultaneously transmit video and audio signals, instead a plurality of cables are needed for connection according to the prior arts, so an installation of home theater system is simplified significantly.

However, if it is needed to arrange a DisplayPort and an HDMI connector on a motherboard 100, as shown in FIG. 1, it has to sacrifice a connecter or use the supporting body 300 to overlap the DisplayPort and the HDMI connector over another or other connectors 200a, 200b due to the limited space in the motherboard 100. This way of arranging the connecting ports of DisplayPort and HDMI onto the motherboard 100 causes a lot of inconveniences to the motherboard 100 in terms of manufacturing procedure.

Accordingly, aiming to solve aforementioned shortcomings, after a substantially devoted study, in cooperation with the application of relatively academic principles, the inventor has finally proposed the present invention that is designed reasonably to possess the capability to improve the prior arts significantly.

SUMMARY OF THE INVENTION

The invention is mainly to integrate DisplayPort connector with HDMI connector in a way, such that after the connection, not only the original connector group is still remained, but also a multi-port connector of DisplayPort and HDMI is possessed.

The invention is to provide a multi-port connector having DisplayPort connector and HDMI connector, including a seat body, a DisplayPort connector, an HDMI connector, a sealing lid and an outer casing. The seat body is arranged a first slot, under which a second slot is arranged. At back of the seat body, there is a recessing part, at upper portion of which an assembling opening communicated to the first slot is arranged. A plurality of slots are arranged on a wall surface of the recessing part. The DisplayPort connector is assembled in the first slot, while the HDMI connector is assembled in the second slot. The sealing lid is assembled to the recessing part at back of the seat body. A protruding portion arranged at the sealing lid is assembled to the assembling opening of the recessing part. On a wall surface of the sealing lid, there are a plurality of striping ribs snapped into the slots. The outer casing externally fitted to the seat body is arranged a first perforation and a second perforation at a front side face thereof. The first and second perforations respectively correspond to a plug-in opening of DisplayPort connector and a slot of HDMI connector, while a set of fixedly connecting legs are extended at a bottom part of a side face of the outer casing.

BRIEF DESCRIPTION OF DRAWING

The features of the invention believed to be novel are set forth with particularity in the appended claims. The invention itself, however, may be best understood by reference to the following detailed description of the invention, which describes an exemplary embodiment of the invention, taken in conjunction with the accompanying drawings, in which:

DETAILED DESCRIPTION OF THE INVENTION

In cooperation with attached drawings, the technical contents and detailed description of the present invention are described thereinafter according to a preferable embodiment, being not used to limit its executing scope. Any equivalent variation and modification made according to appended claims is all covered by the claims claimed by the present invention.

Figure 1:
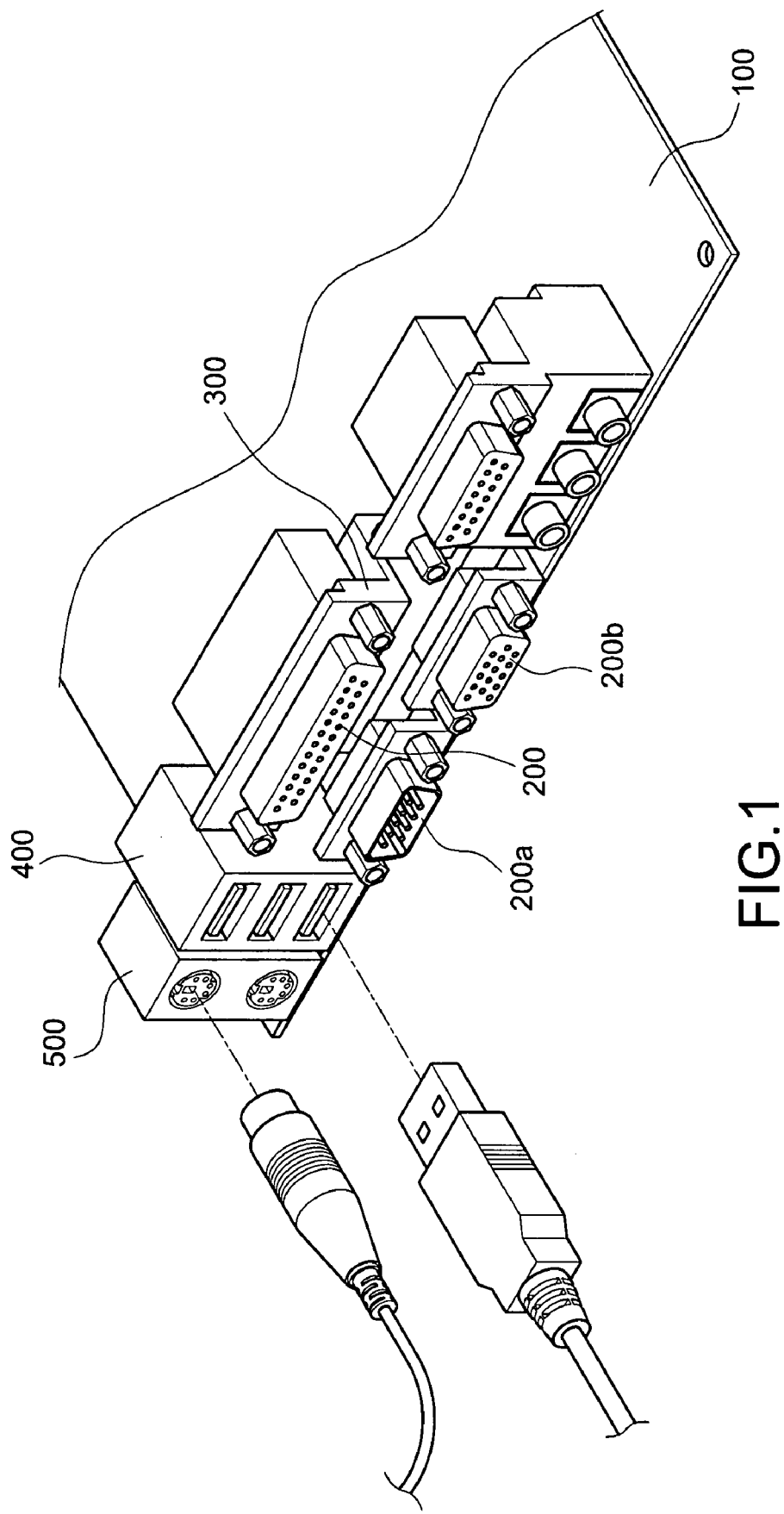
FIG. 1 is a perspective illustration of the outer appearance of a motherboard according to the prior arts.
Figure 2:
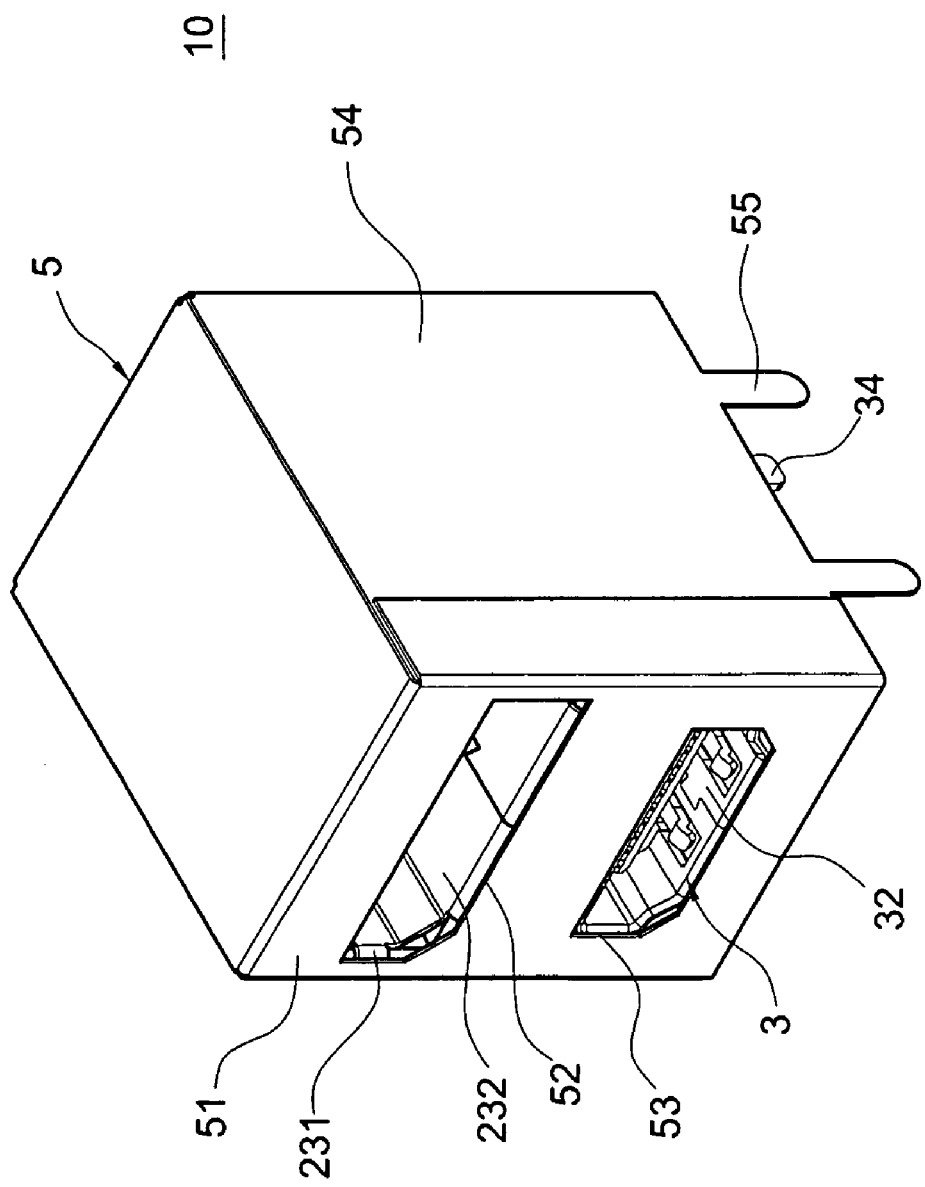
FIG. 2 is a perspective illustration of the outer appearance of a multi-port connector having DisplayPort connector and HDMI connector according to the present invention.
Figure 3:
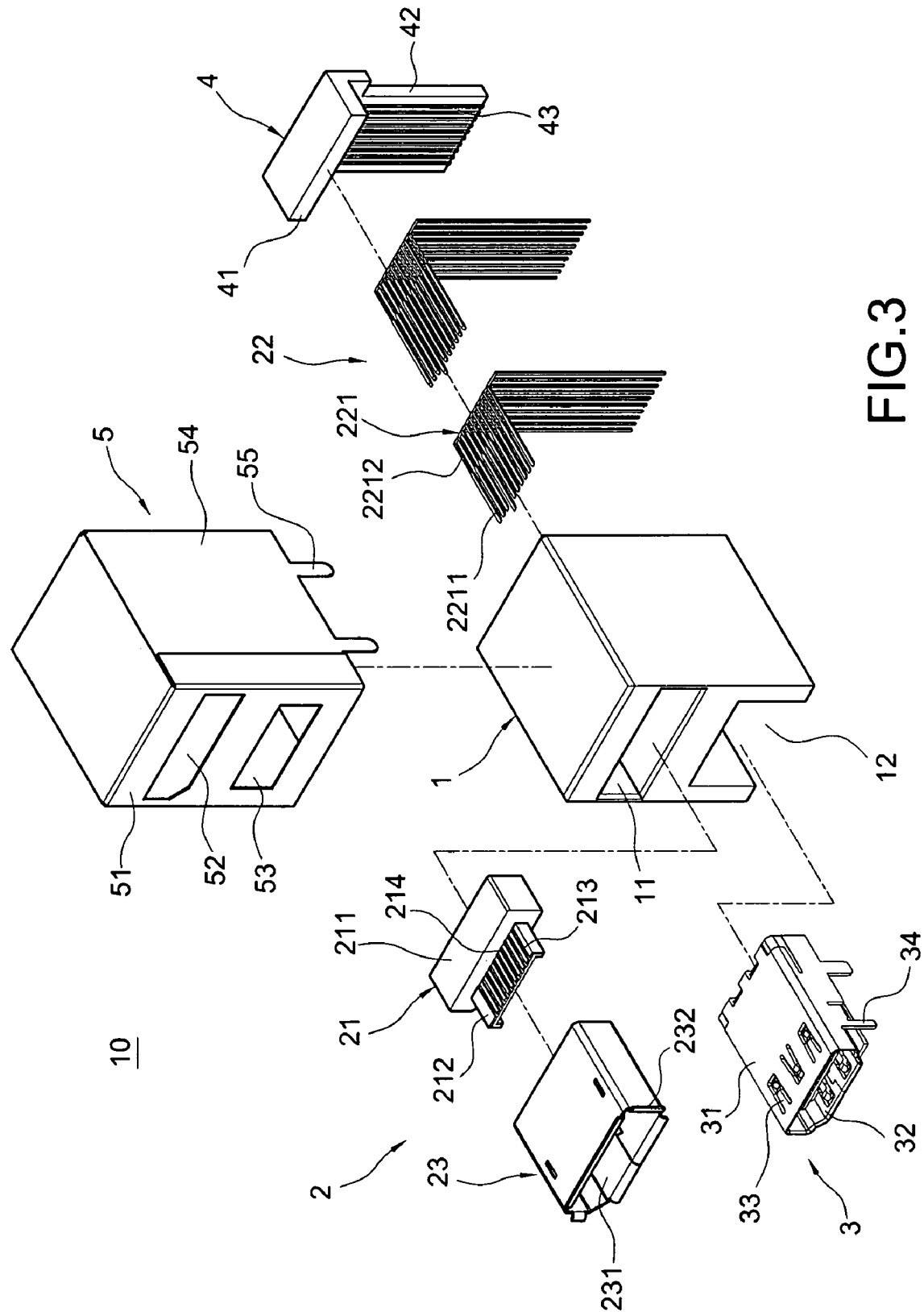
FIG. 3 is an explosive illustration of a multi-port connector having DisplayPort Connector and HDMI connector according to the present invention.
Figure 4:
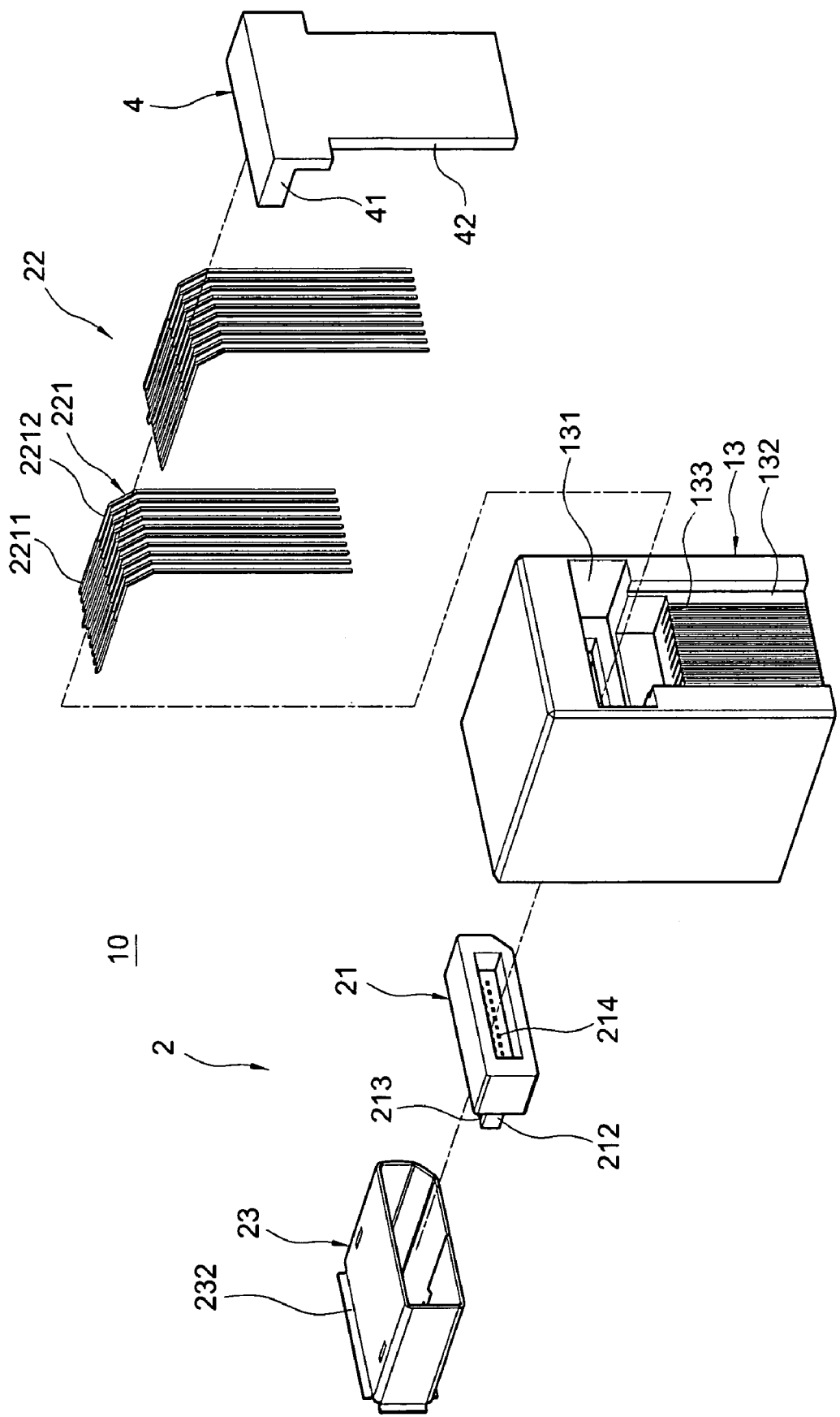
FIG. 4 is an explosive illustration of FIG. 3 viewed from another angle.

Please refer to FIG. 2 and FIG. 3, which respectively are a perspective and explosive illustrations of a multi-port connector having DisplayPort connector and HDMI connector according to the present invention, and also refer to FIG. 4, which is an explosive illustration of FIG. 3 viewed from another angle. As shown in these figures, a multi-port connector having DisplayPort connector and HDMI connector according to the present invention includes a seat body 1, a DisplayPort connector 2, an HDMI connector 3, a sealing lid 4 and an outer casing 5.

In this preferable embodiment, the seat body 1 is made of an electrically insulating material, on which a first slot 11 for assembling the DisplayPort connector 2 is arranged. Under the first slot 11, there is a second slot 12, by which an HDMI connector 3 is arranged. At back of the seat body 1, a "T"-shaped recessing part 13 is arranged, at upper portion of which there is an assembling opening 131 communicated to the first slot 11. Meanwhile, a plurality of slots 133 are arranged on a wall surface 132 of the recessing part 13.

In this case, the DisplayPort connector 2 assembled to the first slot 11 consists of an insulating supporting body 21, a terminal set 22 and a metallic shell 23. At front side of the insulating supporting body 21, a sealing wall 211 is arranged, toward outward direction of which a supporting piece 212 is extended. At front and back sides of the supporting piece 212, a plurality of grooves 213 are respectively arranged. At the grooves 213, a plurality of perforations 214 arranged correspond to the sealing wall 211 for providing the terminal set 22 to pass through. The terminal set 22 is composed of a plurality of connecting legs 221, on each of which a front connecting leg 2211 is arranged, at rear side of which a rear connecting leg 2212 bent into 90 degrees is extended. After the front connecting leg 2211 passes through the perforation 214 and fixedly inserted into the groove 213, the rear connecting leg 2212 is embedded into the slot 133 at back of the seat body 1. At front side of the metallic shell 23, there is a plug-in opening 231, at the circumference of which a plurality of arc stopping pieces 232 are supportively connected, which are abutted against the opening circumference of the first slot 11 of the seat body 1.

Furthermore, the HDMI connector 3 assembled into the second slot 12 of the seat body 1 has a metallic mask 31, in which there is a slot 32. On the metallic mask 31, a plurality of leaf springs 33 arranged correspond to the slot 32 in the interior of the HDMI. After a plug of HDMI transmitting line (not shown in the figure) is plugged in the slot 32, the leaf spring 33 then clips the plug tightly to keep it from loosely moving or coming off. In addition, a set of fixedly connecting legs 34 are extended from a side of the metallic mask 31 and are capable of being fixedly connected to a motherboard (not shown in the figure).

In this preferable embodiment, with a protruding portion 41 arranged thereon, the sealing lid 4 is assembled and connected at back of the seat body 1. When the sealing lid 4 has been assembled and connected to the assembling opening 131 of the recessing part 13 at back of the seat body 1, a plurality of striping ribs 43 arranged on a wall surface 42 of the sealing lid 4 are snapped into the slots 133, making the striping ribs 43 abutted against the rear connecting legs 2212 of the terminal set 22.

In this case, the outer casing 5 made of metallic materials is fitted externally to the seat body 1 by arranging a first perforation 52 and a second perforation 53 at a front side thereof for providing the plugs of DisplayPort and HDMI to pass through. A set of connecting legs 55 extended at a bottom part of a side face 54 of the hollow outer casing 5 are fixedly connected to a motherboard (not shown in the figures). When the plugs of DisplayPort and HDMI are being pulled out or plugged in, it won't create a shaking phenomenon to the multi-port connector, so it is very easy for a user to pull out or plug in a plug of DisplayPort or HDMI.

Figure 5:
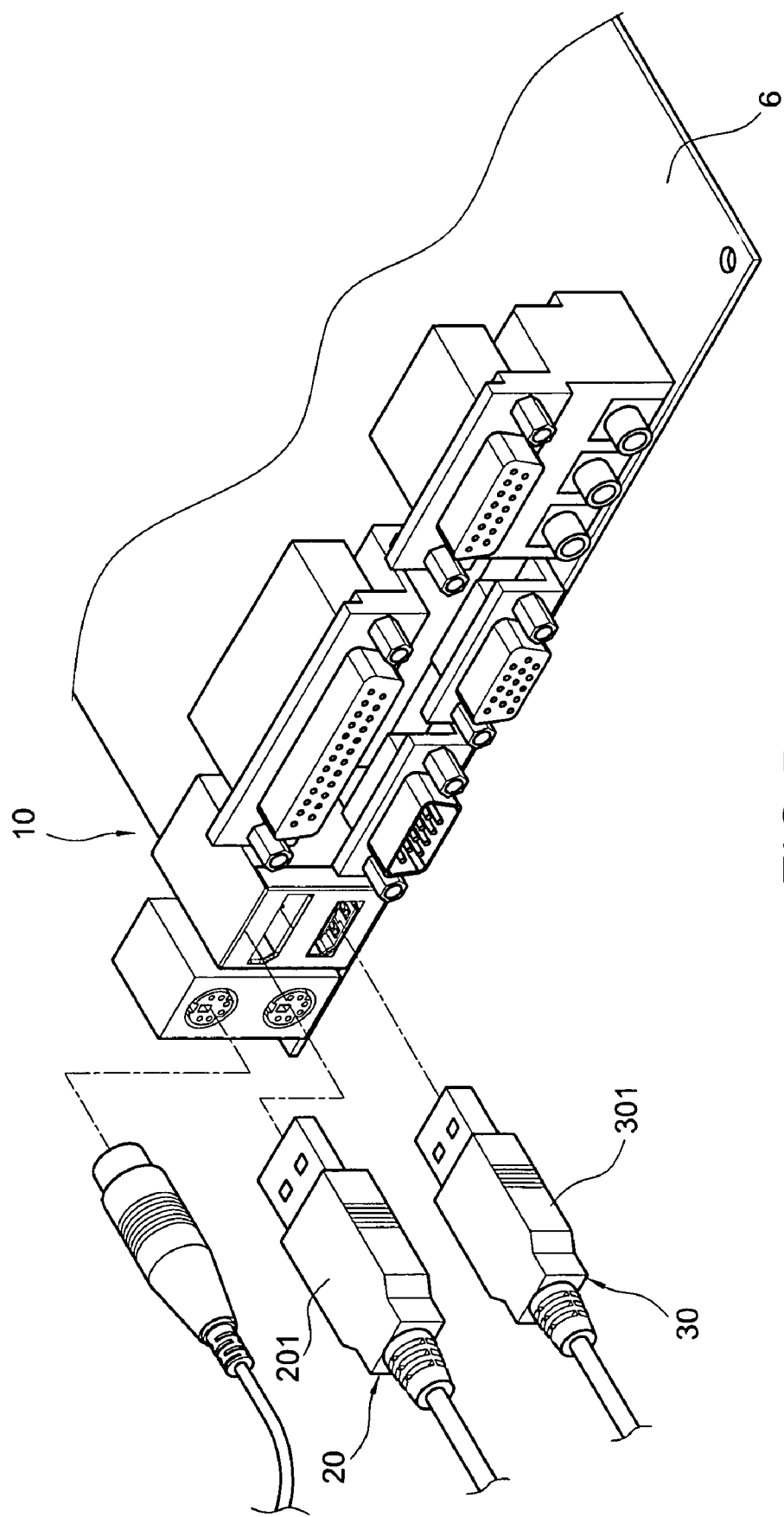
FIG. 5 is a using status illustration of the multi-port connector according to the present invention.

Please refer to FIG. 5, which is a using status illustration of the multi-port connector according to the present invention. As shown in this figure, after the multi-port connector 10 is electrically connected to a circuit board 6, the multi-port connector 10 is fixedly arranged to the circuit board 6. When a user needs to make a multimedia audio-and-video signals' transmission, he only has to plug the DisplayPort plug 201 of the DisplayPort transmission line 20 in the plug-in opening 231 of the multi-port connector 10, making the DisplayPort plug 201 electrically connected to the DisplayPort connector 2, thereby an image signal being able to be transmitted to the monitor (not shown in the figures).

After the HDMI plug 301 of HDMI transmitting line 30 is plugged in the slot 32 of the HDMI connector 3, making the HDMI plug 301 electrically connected to the HDMI connector 3, a multimedia signal transmission of high definition can be processed immediately.

According to the aforementioned structure, a multi-port connector having DisplayPort and HDMI connector of the present invention is thereby obtained.

Summarizing aforementioned description, the invention is an indispensable product of novelty indeed, which may positively reach the expected usage objective for solving the drawbacks of the prior arts, and which extremely possesses the innovation and progressiveness for completely fulfilling the applying merits of new type patent, according to which the invention is thereby applied. Please examine the application carefully and grant it as a formal patent for protecting the rights of the inventor.

However, the aforementioned description is only a preferable embodiment according to the present invention, being not used to limit the patent scope of the invention, so equivalently structural variation made to the contents of the present invention, for example, description and drawings, is all covered by the claims claimed thereinafter.

What is claimed is:

1. A multi-port connector, including:
an insulating seat body, at an upper portion of which a first slot is arranged, under which there is a second slot, a recessing part being arranged at a back of the seat body, an upper portion of the recessing part having an assembling opening communicated to the first slot, and a plurality of slots being arranged on a wall surface of the recessing part;
a first connector assembled into the first slot, the first connector being comprised of an insulating supporting body, a terminal set and a metallic shell, the terminal set being comprised of a plurality of connecting legs each comprising a front connecting leg and a rear connecting leg, the rear connecting leg being embedded into the slots on the wall surface of the recessing part,
wherein a front side of the insulating supporting body is arranged a sealing wall, which is extended outwardly a supporting piece, on a front side and a rear side of which a plurality of grooves are arranged, on the grooves corresponding to the sealing wall, a plurality of perforations being arranged for providing the terminal set to pass through, and
wherein a plug-in opening is arranged at a front of the metallic shell, and wherein a plurality of arc stopping pieces are supportively connected at a circumference of the plug-in opening and abutted against a circumference of the first slot of the seat body;
a second connector assembled into the second slot,
wherein the second connector has a metallic mask, an interior of which has a slot, and on which a plurality of leaf springs arranged correspond to an interior of the slot, and at a side of which a set of fixedly connecting legs are extended; and a sealing lid assembled in the recessing part at back of the seat body, a protruding portion arranged at the sealing lid so as to be inserted into the assembling opening of the recessing part and a plurality of striping ribs arranged on a wall surface of the sealing lid so as to be snapped into the slots, making the striping ribs abutted against the rear connecting legs of the terminal set.

2. The multi-port connector according to claim 1, wherein the recessing part is configured as a "T" shape.

3. The multi-port connector according to claim 1, wherein the rear connecting leg is bent into 90 degrees relative to the front connecting leg.

4. The multi-port connector according to claim 1, further including an outer casing externally fitted to the seat, a first perforation and a second perforation arranged at a front side of the outer casing and a set of connecting legs extended at a bottom part of a side face of the outer casing.

5. The multi-port connector according to claim 4, wherein the outer casing is made of a metallic material.

* * * * *